(12) United States Patent
Lee

(10) Patent No.: US 7,101,786 B2
(45) Date of Patent: Sep. 5, 2006

(54) METHOD FOR FORMING A METAL LINE IN A SEMICONDUCTOR DEVICE

(75) Inventor: Jae Jung Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/138,684

(22) Filed: May 27, 2005

(65) Prior Publication Data

US 2006/0009024 A1 Jan. 12, 2006

(30) Foreign Application Priority Data

Jul. 12, 2004 (KR) ............ 10-2004-0054062

(51) Int. Cl.
*H01L 21/4763* (2006.01)
(52) U.S. Cl. ............ 438/633; 438/673; 438/713; 438/978; 257/E21.578
(58) Field of Classification Search ........ 438/622, 438/633, 673, 713, 978, FOR. 458, FOR. 355, 438/FOR. 489, FOR. 492; 257/E21.578
See application file for complete search history.

(56) References Cited

U.S. PATENT DOCUMENTS 5,458,734 A * 10/1995 Tsukamoto ............ 438/701
6,143,648 A * 11/2000 Rodriguez et al. ...... 438/640
6,407,002 B1 * 6/2002 Lin et al. ................ 438/713
6,511,902 B1 * 1/2003 Liang et al. ............ 438/620
2002/0061654 A1 * 5/2002 Kanegae et al. ........ 438/710

FOREIGN PATENT DOCUMENTS

| KR | 1020020002922 | 1/2002 |
|---|---|---|
| KR | 1020040059733 | 7/2004 |

* cited by examiner

*Primary Examiner*—Michelle Estrada
(74) *Attorney, Agent, or Firm*—Mayer, Brown, Rowe and Maw LLP

(57) ABSTRACT

Provided is a method for forming a metal line in a semiconductor device. The method forms round portions at top edges of an insulation film by means of a polymer and then etches the rest portion (i.e., sidewall parts) in an almost vertical direction, which makes it possible to shrink down a width of a patterned insulation film at maximum nevertheless of a dimension of a metal-line patterning mask. By way the method, an interval between adjacent metal lines is extended at maximum, preventing mutual interference between the metal lines.

6 Claims, 4 Drawing Sheets

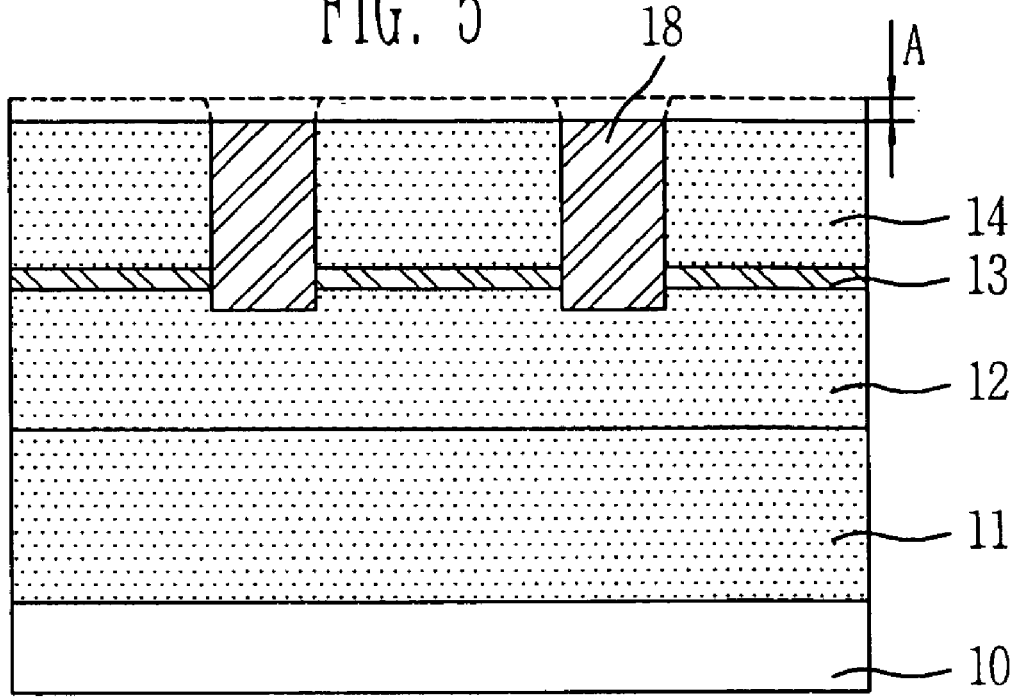
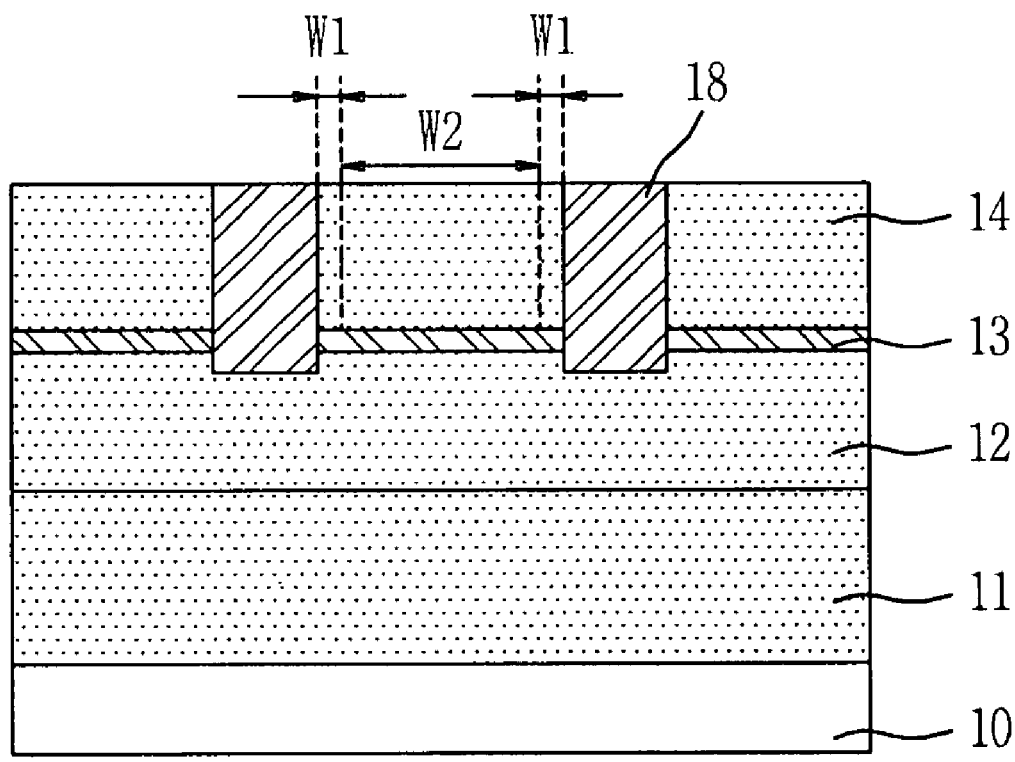

METHOD FOR FORMING A METAL LINE IN A SEMICONDUCTOR DEVICE

BACKGROUND

1. Field of the Invention

The present invention relates to a method for forming a metal line in a semiconductor device and more particularly, to a method for forming a metal line of a semiconductor device advantageous to preventing a malfunction of the semiconductor device.

2. Discussion of Related Art

In conventional technology, a metal line, e.g., a bitline, is formed from etching an interlevel insulation film by way of a damascene process. However, it is difficult to form an interval between interlevel insulation films during a bitline forming process, enough to a desired rate, due to the limit on the capability of a photo-masking equipment. Accordingly, an interval between adjacent bitline is insufficient to induce mutual interference, causing a malfunction of the semiconductor device. In recent, although efforts have been proceeded to enlarge the interval between the interlevel insulation films in order to prevent such a malfunction due to the mutual interference, evaporation and etch-back processes are added to increase the product cost and a turn-around time (TAT).

SUMMARY OF THE INVENTION

The present invention is directed to solve the aforementioned problem, which provides a method for forming a metal line in a semiconductor device, capable of preventing mutual interference by extending an interval between metal lines from shrinking down a width of an interlevel insulation film at maximum during a damascene process with a conventional metal-line patterning mask and thereby preventing a malfunction of the semiconductor device.

An aspect the present invention is to provide a method for forming a metal line of a semiconductor device, the method comprising the steps of: providing a semiconductor substrate in which an insulation film is formed; patterning the insulation film by means of an etching process with a metal-line patterning mask to form a groove and rounding top edges of the patterned insulation film in control of the amount of a polymer generated during the etching process; and forming the metal line in which the groove is buried.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings:

FIGS. 1 through 6 are sectional diagrams illustrating processing steps for forming a metal line in a semiconductor device in accordance with a preferred embodiment of the present invention.

DETAILED DESCRIPTION OF PREFERRED EMBODIMENTS

Figure 1:
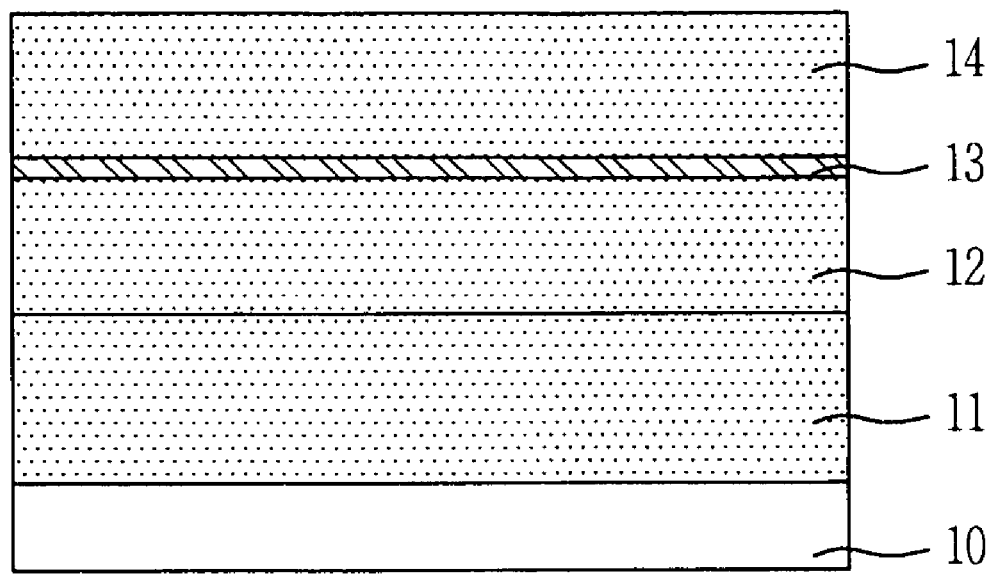

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numerals refer to like elements throughout the specification.

Hereinafter, it will be described about an exemplary embodiment of the present invention in conjunction with the accompanying drawings.

FIGS. 1 through 6 are sectional diagrams illustrating processing steps for forming a metal line in a semiconductor device in accordance with a preferred embodiment of the present invention. It will also be understood that when a layer is referred to as being "on" or "over" another layer or substrate, it can be directly on or over the other layer or substrate, or intervening layers may also be present.

Referring to FIG. 1, a semiconductor substrate 10 is provided by way of a pre-treatment cleaning process. The pre-treatment cleaning process is conducted accompanying with SC-1 ($NH_4OH/H_2O_2/H_2O$) after cleaning the semiconductor substrate by means of DHF (diluted HF), or accompanying with SC-1 sequentially after cleaning the semiconductor substrate by BOE (buffer oxide etchant).

Next, a predetermined semiconductor structure layer (not shown) is formed on the semiconductor substrate 10. Here, the semiconductor structure layer may include at least one of a transistor, a memory cell, a capacitor, a junction layer, a conductive layer, an insulation layer, and metal lines.

After then, an insulation film 11 (hereinafter, referred to as 'first interlevel insulation film') is deposited on the semiconductor structure layer. Here, the first interlevel insulation film 11 is made of an oxide of $SiO_2$ series, or an oxide containing impurities such as C, F, B, P, or In. In other words, the first interlevel insulation film 11 may be a film of BPSG (boron phosphorous silicate glass), PSG (phosphorous silicate glass), USG (undoped silicate glass), FSG (fluorinated silicate glass), or $SiO_2$, or is formed of an oxide film containing hydrogen, fluorine, or carbon. Further, the first interlevel insulation film 11 may be formed of a single film containing the material aforementioned or a composite structure in which at least more two layers are stacked.

Next, the first interlevel insulation film 11 is flattened by way of a planarization process. It is preferred for the planarization process to be prosecuted in the form of CMP (chemical and mechanical polishing).

And, an additional insulation film 12 (hereinafter, referred to as 'second interlevel insulation film') is deposited on the first interlevel insulation level 11. Here, the second interlevel insulation film 12 may be formed of the same material with the first interlevel insulation film 11, or an oxide film of a SOG (spin on glass) film, a PETEOS (plasma enhanced tetra ethyle ortho silicate) film, or an HDP (high density plasma) film.

Next, the second interlevel insulation film 12 may be flattened by means of a planarization process in the form of CMP.

After then, an etch stopping layer 13 is deposited on the second interlevel insulation film 12. Here, the etch stopping layer 13 may be formed of a nitride film or oxy-nitride film that has the high selectivity for an oxide film. For example, the etch stopping layer may be made of one among TaN, TaAlN, TiN, TaSiN, WN, WBN, and SiON. Such a material for the etch stopping layer 13 is able to be deposited thereon by means of PVD (physical vapor chemical vapor deposition), CVD (chemical vapor deposition), or ALD (atomic layer deposition). Further, the etch stopping layer 13 is deposited in the thickness of 200~700 Å.

Next, an additional insulation film 14 (hereinafter, referred to as 'third interlevel insulation film') is deposited on the etch stopping layer 14. Here, the third interlevel insulation film 14 may be formed of the same material with the first interlevel insulation film 11 or the second interlevel insulation film 12.

Next, the third interlevel insulation film 14 may be flattened by way of a planarization process in the form of CMP.

Figure 2:
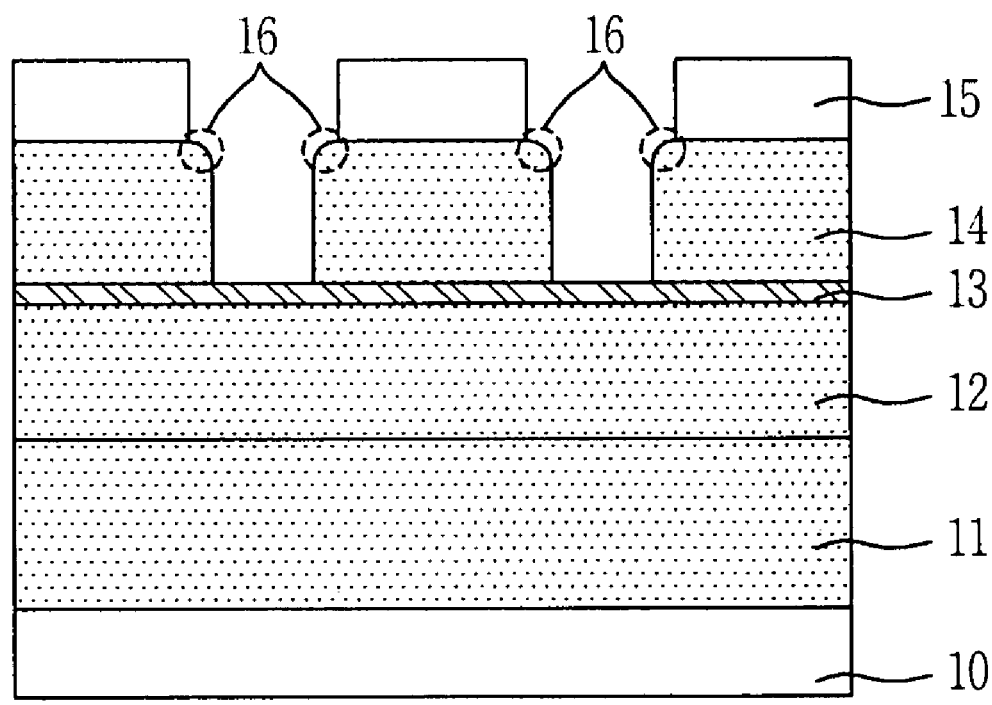

Referring to FIG. 2, after depositing a photoresist film (not shown) on the third interlevel insulation film 14, an exposing and developing process with a photo mask is carried out to form a photoresist pattern 15. Here, the photoresist pattern 15 is a patterning mask to define a pattern of a metal line (e,g., a bitline), similar to a general patterning mask used in a semiconductor manufacturing process.

And then, the third interlevel insulation film 14 is patterned by means of an etching process with the photoresist pattern 15. Thus, the top surface of the etch stopping layer 13 is disclosed. During this, the etching process progresses through first and second steps in order to differentiate etching angles. The first step is prosecuted in the angle of 40~70° to generate plenty of polymer at the disclosed portions, so that top edges of the third interlevel insulation film 14, as like the reference numeral 16, are rounded by the polymer. The second step is conducted to form an etching angle in 60~80°. And, it is preferred for the etching process to make the etch stopping layer 13 remain, by controlling the etch ratio between the third interlevel insulation film 14 and the etch stopping layer 13 to be 15:1 at least, even when the third interlevel insulation film 14 is excessively etched away in 50%. Further, the first step is directed to make the etch target be in 500~1000 Å.

Meanwhile, the etching angles are based on the top surface of the third interlevel insulation film 14, being established on 0° for the top surface while on 90° in a vertical mode for the top surface of the third interlevel insulation film 14.

As aforementioned, in controlling the etching angles by means of generating the polymers during the etching process, the amount of the polymer is adjusted in accordance with a mixed ratio of $C_xF_y$ gas (where x and y are 0 or a natural number) and $CH_2F_2$ gas. In other words, the polymer of C—H—F series is generated while the $C_xF_y$ and $CH_2F_2$ gas forms gaseous plasma, in which the amount of the polymer increases along an increase of the ratio of the $CH_2F_2$ gas. As the amount of the polymer increases, the etching angle becomes smaller.

According as that, the first and second steps proceed with the $C_xF_y$ and $CH_2F_2$ gas, but the second step is conducted further with $O_2$ gas in order to restrain the generation of the polymer.

As like this, it is possible to minimize a width of a groove (refer to the reference numeral 17 in FIG. 3), in which a metal line (refer to the reference numeral 18 in FIGS. 5 and 6) is deposited, by forming the polymer through the etching process even with the photoresist pattern 15 generally used in a semiconductor manufacturing field. And, the width of the groove 17 is controllable by means of a mixed ratio of the etching gas during the etching process. Here, the groove 17 may be a contact hole, a via hole, or a trench. For example, the groove 17 is formed to be a trench if the etching process is carried out in the type of a single or dual damascene method.

Figure 3:
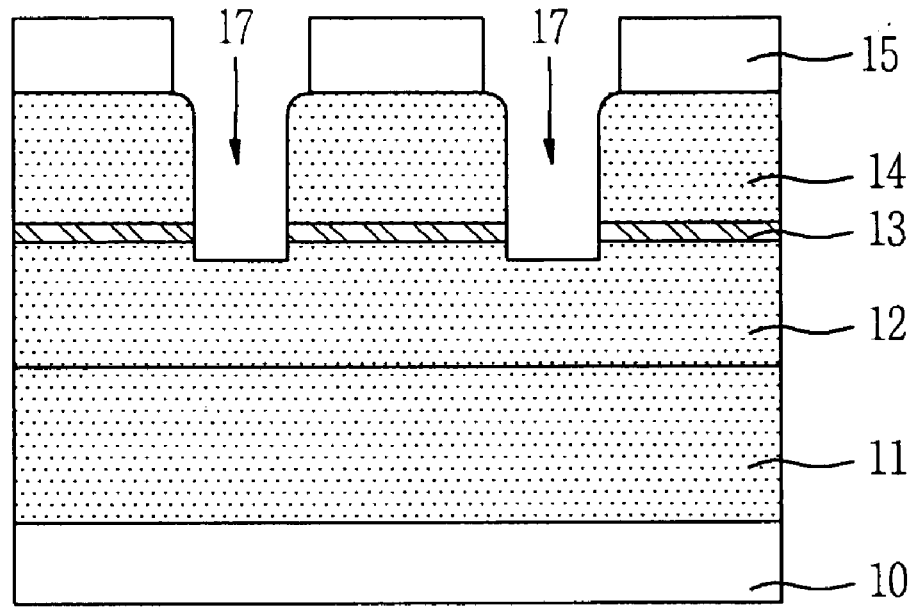

Referring to FIG. 3, the etch stopping layer 13 is removed by means of an etching process. During this, the second interlevel insulation film 12 may be partially etched away. Thus, the groove 17 is formed. Meanwhile, it is also possible to etch the second interlevel insulation film by prosecuting another etching process, in addition to the former etching process to remove the etch stopping layer 13, in which an etching target is directed to be 300~700 Å in thickness.

After then, the photoresist pattern 15 is removed by means of a striping process.

Figure 4:
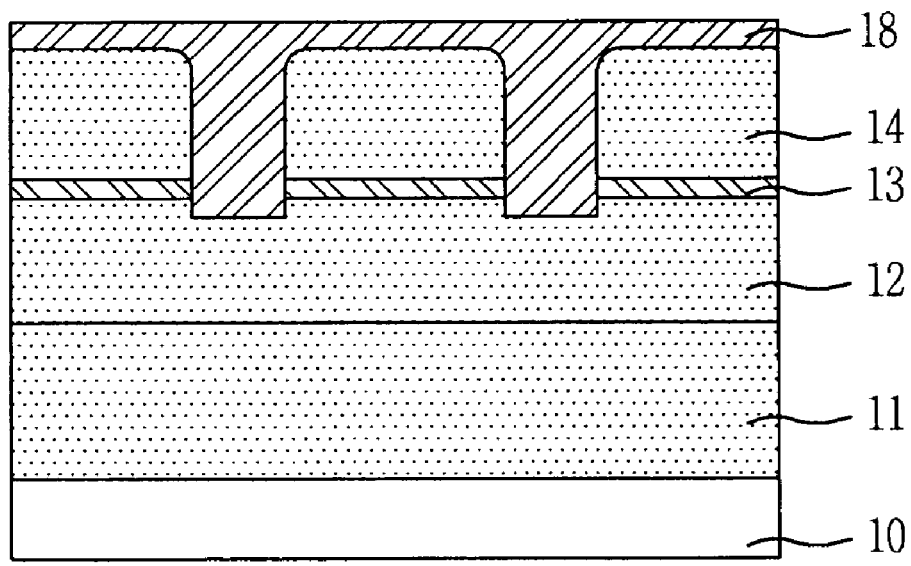

Referring to FIG. 4, a metal layer 18 is deposited on the overall structure to bury the groove 17. Here, the metal layer 18 may be formed of one among W, Al, Ti, and Cu. A way of depositing the metal layer 18 may be applicable with PVD, CVD, or ALD.

Referring to FIG. 5, the entire surface of the overall structure is flattened by means of a CMP process. During this, the CMP process is carried out to remove the round portions, which have been formed in the etching step shown in FIG. 2, by the thickness of A. After completing the CMP process, the upper portion of the second interlevel insulation film 14 is removed by the thickness of 300~600 Å. As a result, a metal line is formed with including the buried groove 17. Here, the metal line may be used as a bitline, a wordline, or a source line in a semiconductor memory device such as a DRAM, a flash memory, an SRAM, or a DDR RAM.

Now, it will be describes about the feature of comparing the interval between metal lines formed by the method of the present invention with that formed by the conventional method.

Figure 7:
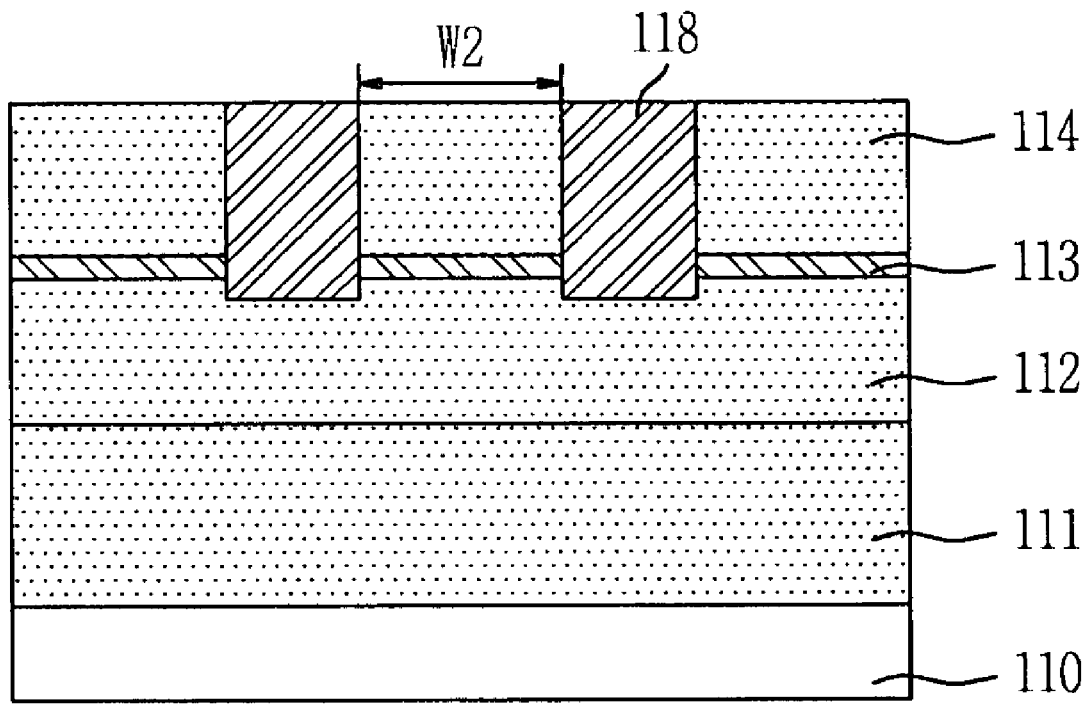
FIG. 7 is a sectional diagram illustrating a metal line of a semiconductor device.

FIG. 6 is a sectional diagram illustrating a metal line generated by the method of forming the metal line in accordance with the preferred embodiment of the present invention, and FIG. 7 is a sectional diagram illustrating a metal line of a semiconductor device by a conventional method of forming the metal line of a semiconductor device (i.e., vertically patterning a part of the third interlevel insulation film in which the metal line is formed). In FIG. 7, the reference numeral 110 denotes a semiconductor substrate; the reference numeral 111 denotes a first interlevel insulation film; the reference numeral 112 denotes a second interlevel insulation film; the reference numeral 113 denotes an etch stopping layer; and the reference numeral 114 denotes a third interlevel insulation film; and 118 denotes a metal line.

Referring FIGS. 6 and 7, it can be seen that the interval W2+W1+W1 between metal lines shown in FIG. 6, which are provided by the method of forming the metal line in accordance with the preferred embodiment of the present invention, is wider than the interval W2 between the metal lines formed by the conventional method shown in FIG. 7.

As described above, according to the prevent invention, it maximizes an interval between adjacent metal lines, for which a width of an interlevel insulation film is minimized, nevertheless of a dimension of a metal-line patterning mask, by almost vertically etching remaining parts (i.e., sidewall portions) after forming rounding portions at the top edges by means of a polymer during an etching process for forming the metal lines. As a result, it prevents mutual interference between adjacent metal lines.

Moreover, the present invention is advantageous to reduce the product cost and a time consumed in manufacturing a semiconductor device because it uses a conventional patterning mask without preparing an additional metal-line patterning mask for the process of the present invention.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method for forming a metal line of a semiconductor device, the method comprising the steps of:
   (a) providing a semiconductor substrate in which an insulation film is formed;
   (b) performing a first etching process to etch a given region of the insulation film so that top edges of the insulation film are rounded with a first etching angle being determined by a polymer generated during the first etching process;
   (c) performing a second etching process using a mixed gas of CxFy, $CH_2F_2$ and $O_2$ to etch the given region of the insulation film so that a second etching angle of sidewall of the isolation film is larger than the first etching angle by reducing an amount of the polymer, thereby forming a groove; and
   (d) forming the metal line in the groove.

2. The method as set forth in claim 1, wherein the first and second etching processes are performed with a metal line patterning mask to define an area on which the groove is formed.

3. The method as set forth in claim 1, wherein the first etching angle is 40~70°.

4. The method as set forth in claim 1, wherein the second etching angle is 60~80°.

5. The method as set forth in claim 1, wherein the first etching process is performed using a mixed gas of CxFy and $CH_2F_2$ so that the polymer is generated.

6. The method as set forth in claim 1, further comprising the step of performing a third etching process to etch an upper portion of the insulation film and the metal line so that rounded top edges of the insulation film are removed, thereby increasing a width between adjacent metal lines.

* * * * *